US007579678B2

(12) United States Patent
Suzuki et al.

(10) Patent No.: US 7,579,678 B2
(45) Date of Patent: Aug. 25, 2009

(54) SEMICONDUCTOR MICROPHONE UNIT

(75) Inventors: Toshihisa Suzuki, Hamamatsu (JP); Junya Suzuki, Iwata (JP)

(73) Assignee: Yamaha Corporation, Shizuoka-Ken (JP)

( * ) Notice: Subject to any disclaimer, the term of this patent is extended or adjusted under 35 U.S.C. 154(b) by 91 days.

(21) Appl. No.: 11/848,837

(22) Filed: Aug. 31, 2007

(65) Prior Publication Data

US 2008/0083961 A1 Apr. 10, 2008

(30) Foreign Application Priority Data

Sep. 4, 2006 (JP) .......................... P2006-239499

(51) Int. Cl.
*H01L 23/02* (2006.01)

(52) U.S. Cl. ...................................... 257/678; 257/419

(58) Field of Classification Search ................. 257/678, 257/704, 414-416, 418-420; 381/174
See application file for complete search history.

(56) References Cited

U.S. PATENT DOCUMENTS 5,856,914 A * 1/1999 O'Boyle ..................... 361/761
7,166,910 B2 * 1/2007 Minervini ................... 257/704
7,386,136 B2 * 6/2008 Ohbayashi et al. .......... 381/174

FOREIGN PATENT DOCUMENTS

JP 2003-508997 3/2003
JP 2004-537182 A 12/2004

* cited by examiner

*Primary Examiner*—Roy K Potter
(74) *Attorney, Agent, or Firm*—DicksteinShapiroLLP

(57) ABSTRACT

A semiconductor microphone unit includes a semiconductor microphone chip having a diaphragm covering an inner hole of a support. The support is adhered onto the surface of a support substrate whose thermal expansion coefficient higher than the thermal expansion coefficient of the support via a thermosetting adhesive in such a way that the diaphragm is positioned opposite to the surface of the support substrate. The thermosetting adhesive has a tensile elastic modulus allowing a contraction of the support substrate to be transmitted to the support in a hardened state when the semiconductor microphone chip is cooled together with the support substrate. Thus, it is possible to reduce the tensile stress of the diaphragm, which occurs during the manufacturing of the semiconductor microphone chip, thus preventing the diaphragm from being unexpectedly reduced in strength; hence, it is possible to improve the sensitivity of the semiconductor microphone chip.

4 Claims, 2 Drawing Sheets

SEMICONDUCTOR MICROPHONE UNIT

BACKGROUND OF THE INVENTION

1. Field of the Invention

The present invention relates to semiconductor microphone units such as silicon condenser microphones for detecting pressure variations such as sound pressure variations by use of diaphragms. The present invention also relates to manufacturing methods of semiconductor microphone units as well as methods for mounting semiconductor microphone units on substrates or circuit boards.

This application claims priority on Japanese Patent Application No. 2006-239499, the content of which is incorporated herein by reference.

2. Description of the Related Art

Conventionally, semiconductor microphone chips such as silicon condenser microphones, which detect pressure variations such as sound pressure variations by use of diaphragms, are mounted on the surfaces of substrates or circuit boards, with which they form microphone packages. For example, Japanese Patent Application Publication No. 2004-537182 teaches a miniature silicon condenser microphone, and Japanese Patent Application Publication No. 2003-508997 teaches a pressure converter adapted to a condenser microphone system. These types of semiconductor microphone chips are each designed such that a diaphragm is arranged to cover the inner hole of a support.

The aforementioned semiconductor microphone chips are manufactured by way of manufacturing processes of semiconductor devices, in which an impurities-doped polycrystal silicon film serving as a diaphragm is formed by way of chemical vapor deposition (CVD) at a high temperature and is then cooled down so that tensile stress occurs therein.

The tensile stress reduces the deflection of the diaphragm due to pressure variations such as sound pressure variations, thus reducing the audio sensitivity.

In order to reduce the tensile stress, the diaphragm is attached to the support via a plurality of springs so that the diaphragm is distanced from the support. In this case, the diaphragm is reduced in strength when it is distanced from the support.

SUMMARY OF THE INVENTION

It is an object of the present invention to provide a semiconductor microphone unit having a high sensitivity by use of a diaphragm having a relatively high strength.

It is another object of the present invention to provide a mounting method for mounting the semiconductor microphone unit on a substrate or a circuit board.

It is a further object of the present invention to provide a manufacturing method of the semiconductor microphone unit.

In a first aspect of the present invention, a semiconductor microphone unit includes a semiconductor microphone chip that has a diaphragm covering an inner hole of a support, and a support substrate whose thermal expansion coefficient is higher than a thermal expansion coefficient of the support. Herein, the support is adhered onto the surface of the support substrate via the thermosetting adhesive in such a way that the diaphragm is positioned opposite to the surface of the support substrate. The thermosetting adhesive has a tensile elastic modulus that allows a contraction, which occurs in the support substrate when the semiconductor microphone chip and the support substrate are cooled, to be transmitted to the support in the hardened state of the thermosetting adhesive. During the manufacturing of the semiconductor microphone unit, the semiconductor microphone chip is adhered to the support substrate via the thermosetting adhesive, which is then heated and hardened. Herein, both of the semiconductor microphone chip and the support substrate are heated and are thus expanded; hence, the support of the semiconductor microphone chip is fixed to the support substrate in such an expanded state; then, they are cooled down. During the cooling, the contraction of the support substrate becomes larger than the contraction of the support of the semiconductor microphone chip, whereby the contraction of the support substrate due to the difference between the contraction of the support substrate and the contraction of the support is transmitted to the support via the thermosetting adhesive and is exerted to contract the diaphragm, which is positioned opposite to the surface of the support substrate. This makes it possible to reduce the tensile stress of the diaphragm. This also makes it possible to prevent the strength of the diaphragm from being unexpectedly reduced because, unlike the conventionally-known technology, the present invention does not require separation of the diaphragm from the support.

In the above, a through-hole is formed in the support substrate so as to expose the diaphragm to the exterior via the inner hole of the support. The semiconductor microphone unit is mounted on the surface of a base substrate via the mounting adhesive in such a way that the backside of the support substrate is positioned opposite to the surface of the base substrate, wherein the diaphragm directly faces the base substrate via the inner hole and the through-hole. That is, a cavity that is isolated from the external space is defined by the inner hole, the through-hole, the diaphragm, and the base substrate. The through-hole increases the volume of the cavity. When the cavity has a relatively small volume, the internal pressure of the cavity may easily increase in response to vibration of the diaphragm; hence, the diaphragm may be difficult to be deflected. By increasing the volume of the cavity, it is possible to suppress the increase of the internal pressure in the cavity. This makes it possible for the diaphragm to be easily deflected.

In a second aspect of the present invention, there is provided a mounting method for mounting the semiconductor microphone unit on the base substrate, wherein the backside of the support substrate is positioned opposite to the base substrate, and then the support substrate is adhered to the base substrate via the mounting adhesive having a thermosetting property. The mounting adhesive has a tensile elastic modulus for absorbing a stress, which occurs due to a difference between the thermal expansion coefficient of the support substrate and the thermal expansion coefficient of the base substrate, in the hardened state of the mounting adhesive. Since the semiconductor microphone unit is produced in advance and is then mounted on the base substrate, it is possible to prevent the semiconductor microphone chip from being affected by the contract and expansion of the base substrate, which may occur due to thermal cycles for repeatedly heating and cooling the semiconductor microphone unit and the base substrate. Specifically, both of the semiconductor microphone unit and the base substrate are heated so as to harden the mounting adhesive, thus adhering the support substrate to the base substrate, wherein all the semiconductor microphone chip, the support substrate, and the base substrate are heated and expanded. After completion of the hardening of the mounting adhesive realizing the mutual fixation of the support substrate and the base substrate, the semiconductor microphone unit and the base substrate are cooled down, wherein a stress occurs between the support substrate and the base substrate due to the difference between the thermal expansion coefficient of the support substrate and the thermal expansion coefficient of the base substrate. The stress is reliably absorbed by the mounting adhesive; hence, it is possible to prevent the support substrate and the base substrate from being unexpectedly deformed due to the stress exerted therebetween. That is, it is possible to easily prevent the semiconductor microphone chip from being unexpectedly deformed during the mounting operation of the semiconductor microphone unit mounted on the base substrate.

In a third aspect of the present invention, a manufacturing method of the semiconductor microphone unit is provided, wherein the semiconductor microphone chip is produced in advance; the diaphragm is positioned opposite to the surface of the support substrate; then, the support is adhered to the surface of the support substrate via the thermosetting adhesive. Herein, it is possible to reduce the tensile stress of the diaphragm, which occurs during the manufacturing of the semiconductor microphone chip, by simply adhering the support of the semiconductor microphone chip to the support substrate via the thermosetting adhesive.

In summary, the present invention offers the following effects.

(a) It is possible to easily reduce the tensile stress of the diaphragm by way of the contraction of the support substrate; hence, it is possible to improve the sensitivity of the semiconductor microphone chip. In addition, it is possible to prevent the strength of the diaphragm from being degraded.

(b) Since the thermosetting adhesive is hardened and then cooled, it is possible to reliably transmit the contraction of the support substrate to the support of the semiconductor microphone chip; hence, it is possible to reliably reduce the tensile stress of the diaphragm.

(c) By increasing the volume of the cavity, it is possible for the diaphragm to be easily deflected; hence, it is possible to avoid the degradation of the sensitivity of the semiconductor microphone chip.

(d) It is possible to easily prevent the semiconductor microphone chip from being deformed irrespective of thermal cycles for repeatedly heating and cooling the semiconductor microphone unit and the base substrate when the semiconductor microphone unit is mounted on the base substrate. In addition, it is possible to avoid the occurrence of stress in the diaphragm when the semiconductor microphone unit is mounted on the base substrate.

BRIEF DESCRIPTION OF THE DRAWINGS

These and other objects, aspects, and embodiments of the present invention will be described in more detail with reference to the following drawings, in which.

DESCRIPTION OF THE PREFERRED EMBODIMENT

The present invention will be described in further detail by way of examples with reference to the accompanying drawings.

Figure 1:
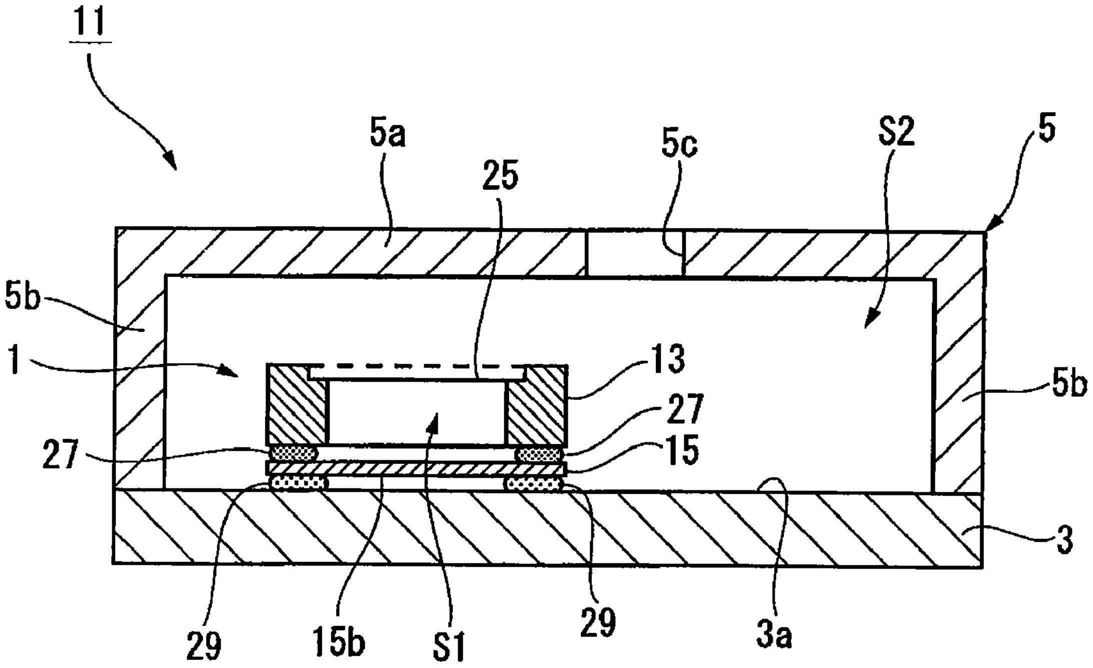
FIG. 1 is a cross-sectional view showing the constitution of a microphone package having a silicon microphone unit in accordance with a preferred embodiment of the present invention.

A silicon microphone unit (or a semiconductor microphone unit) 1 according to a preferred embodiment of the present invention will be described with reference to FIGS. 1 and 2. As shown in FIG. 1, the silicon microphone unit 1 is mounted on a surface 3*a* of a base substrate 3 and is covered with a cover 5. A microphone package 11 is constituted of the silicon microphone unit 1, the base substrate 3, and the cover 5. When the base substrate 3 is mounted on a circuit board (not shown), the microphone package 11 is electrically connected to the circuit board.

The silicon microphone unit 1 is constituted of a silicon microphone chip (or a semiconductor microphone chip) 13 mounted on the surface 3*a* of the base substrate 3 and a support substrate 15 inserted between the silicon microphone chip 13 and the base substrate 3.

Figure 2:
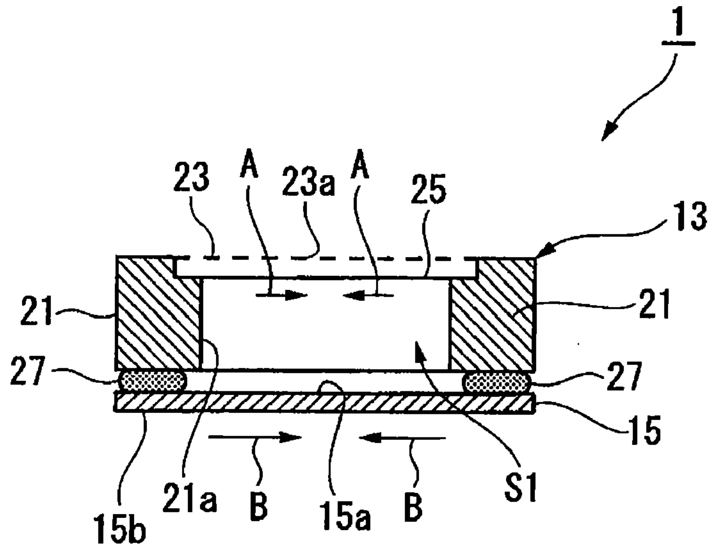
FIG. 2 is a cross-sectional view showing the constitution of the silicon microphone unit included in the microphone package shown in FIG. 1.

As shown in FIG. 2, the silicon microphone chip 13 composed of silicon is constituted of a support 21 having an inner hole 21*a*, which has a circular shape in plan view, a back plate 23 having a disk-like shape for covering the upper end of the inner hole 21*a*, and a diaphragm 25 having a disk-like shape that is positioned in proximity to the inner hole 21*a* of the support 21 in parallel with the back plate 23. The back plate 23 is a conductive semiconductor membrane having a disk-like shape, which is composed of polycrystal silicon, wherein a plurality of holes 23*a* are formed to run through the back plate 23 in its thickness direction. The diaphragm 25 is a conductive semiconductor membrane having a disk-like shape, which is composed of polycrystal silicon doped with impurities such as phosphorus (P).

A bias voltage is applied between the back plate 23 and the diaphragm 25 in the silicon microphone chip 13, whereby the silicon microphone chip 13 detects pressure variations such as sound pressure variations by detecting variations of electrostatic capacitance between the back plate 23 and the diaphragm 25 on the basis of the vibration of the diaphragm 25.

The support substrate 15 is composed of a material whose thermal expansion coefficient is higher than the thermal expansion coefficient of silicon forming the support 21. Specifically, the thermal expansion coefficient of silicon is approximately 3 ppm/K; hence, it is preferable that the support substrate 15 be composed of a metal material such as a copper alloy and a 42-alloy (i.e., iron-nickel alloy). The support substrate 15 is not necessarily composed of the metal material; that is, the support substrate 15 can be composed of any type of material whose thermal expansion coefficient is higher than the thermal expansion coefficient of silicon such as a resin material.

The diaphragm 25 is positioned opposite to a surface 15*a* of the support substrate 15, wherein the support 21 of the silicon microphone chip 13 is adhered onto the surface 15*a* of the support substrate 15 via a thermosetting adhesive 27. The thermosetting adhesive 27 is embedded between the support substrate 15 and the lower surface of the support 21 of the silicon microphone chip 13. When the thermosetting adhesive 27 is hardened, a cavity S1, which is defined by the inner hole 21*a*, the diaphragm 25, and the surface 15*a* of the support substrate 15, is substantially sealed from the external space. Due to the cavity S1 being sealed in an airtight manner, pressure differences may occur at both ends of the diaphragm 25 in response to temperature variations and atmospheric pressure variations. For this reason, it is possible to form thin holes by not applying the thermosetting adhesive 27 to prescribed areas between the support substrate 15 and the support 21, whereby the cavity S1 communicated with the external space via the prescribed areas.

As the thermosetting adhesive 27, it is possible to use an epoxy adhesive such as "EN-4072", which is produced by Hitachi Chemical Co. Ltd. in Japan. This type of the thermosetting adhesive 27 is hardened at a high temperature of 150° C., which is maintained for 60 minutes, for example, wherein the tensile elastic modulus at the hardened state is 3600 MPa or more. The tensile elastic modulus of the thermosetting adhesive 27 is set to an extent that contraction, which occurs in the support substrate 15 when the silicon microphone chip 13 and the support substrate 15 are cooled, is transmitted to the support 21 of the silicon microphone chip 13 in the manufacturing method of the silicon microphone unit 1. The thermosetting adhesive 27 is mixed with fillers.

As shown in FIG. 1, the base substrate 3 is a multilayered wiring substrate having electrical wiring portions (not shown); hence, it is capable of electrically connecting with the silicon microphone chip 13. Electrical connection between the silicon microphone chip 13 and the base substrate 3 is established by way of wire bonding.

The support substrate 15 of the silicon microphone unit 1 is adhered to the surface 3*a* of the base substrate 3 via a mounting adhesive 29 having thermosetting properties.

As the mounting adhesive 29, it is possible to use an acrylic adhesive such as "EN-4900F-1", which is produced by Hitachi Chemical Co. Ltd. Similar to the thermosetting adhesive 27, the mounting adhesive 29 is hardened at a high temperature of 150° C., which is maintained for 60 minutes, for example, wherein the tensile elastic modulus at the hardened state ranges from 300 MPa to 500 MPa. The tensile elastic modulus of the mounting adhesive 29 is set to an extent that stress, which occurs between the support substrate 15 and the base substrate 3 due to differences of thermal expansion coefficients therebetween, can be absorbed in the mounting method of the silicon microphone unit 1.

The cover 5 is constituted of a top wall 5*a* having a rectangular shape, which is distanced from the surface 3*a* of the base substrate 3 in the thickness direction, and a side wall 5*b*, which is fixed to the periphery of the surface 3*a* of the base substrate 3. That is, the cover 5 entirely forms a recess that is opened by way of the side wall 5*b* projecting from the peripheral portion of the top board 5*a*.

When the distal ends of the side wall 5*b* are attached onto the surface 3*a* of the base substrate 3, a hollow space S2 embracing the silicon microphone chip 13 is defined by the base substrate 3 and the cover 5. The hollow space S2 communicates with the external space of the microphone package 11 via an opening 5*c* that is formed at a prescribed position of the top wall 5*a*.

In the manufacturing of the microphone package 11, the silicon microphone unit 1 is produced in advance and is then mounted on the base substrate 3, which is then covered with the cover 5.

Next, a manufacturing method of the silicon microphone unit 1 will be described in detail, wherein the silicon microphone chip 13 is first produced. As shown in FIG. 2, a polycrystal silicon membrane, which is doped with impurities such as phosphorus (P), is formed above the support 21 as the diaphragm 25 by way of CVD. After completion of the formation of the diaphragm 25, when the silicon microphone chip 13 is cooled, a tensile stress occurs in the diaphragm 25, wherein it is exerted in a horizontal direction (i.e., a direction A) that matches a plane direction of the diaphragm 25.

After completion of the formation of the diaphragm 25, the back plate 23 is formed by way of CVD. The back plate 23 is etched by way of RIE so that a plurality of holes 23*a* are formed in the back plate 23. Thus, it is possible to completely produce the silicon microphone chip 13.

Next, the diaphragm 25 is positioned opposite to the surface 15*a* of the support substrate 15, and then the support 21 of the silicon microphone chip 13 is adhered onto the surface 15*a* of the support substrate 15 via the thermosetting adhesive 27.

The adhesion is realized in such a way that the thermosetting adhesive 27 is applied and embedded between the support substrate 15 and the surrounding area of the inner hole 21*a* of the silicon microphone chip 13 at first; then, the thermosetting adhesive 27 is hardened so as to mutually fix the support 21 of the silicon microphone chip 13 and the support substrate 15. The thermosetting adhesive 27 is hardened by being heated from room temperature (e.g., 25° C.) to a high temperature of 150° C., which is maintained for 60 minutes, for example. During heating, the silicon microphone chip 13 and the support substrate 15 are heated as well so that the silicon microphone chip 13 may be horizontally expanded along the surface 15*a* of the support substrate 15. Hence, the support 21 of the silicon microphone chip 13 is fixed onto the support substrate 15 while the silicon microphone chip 13 is horizontally expanded.

After the silicon microphone chip 13 is mutually fixed to the support substrate 15, both of the silicon microphone chip 13 and the support substrate 15 are cooled to room temperature. During cooling, the support substrate 15 may be greatly contracted rather than the support 21 of the silicon microphone chip 13. However, the support 21 of the silicon microphone chip 13 is fixed to the support substrate 15 via the thermosetting adhesive 27, a contraction of the support substrate 15 due to differences of contraction is transmitted to the support 21 of the silicon microphone chip 13 via the thermosetting adhesive 27. Herein, a contraction direction (i.e., a direction B) of the support substrate 15 lies along the surface 15*a* of the support substrate 15, which matches the plane direction of the diaphragm 25. Hence, the contraction of the support substrate 15 is exerted to contract the diaphragm 25. This makes it possible to reduce the tensile stress of the diaphragm 25.

Thus, it is possible to completely produce the silicon microphone unit 1 by way of the aforementioned manufacturing method.

Next, a mounting method for mounting the silicon microphone unit 1 onto the base substrate 3 will be described in detail.

In the mounting method, as shown in FIG. 1, the backside 15*b* of the support substrate 15 is positioned opposite to the base substrate 3, and then the support substrate 15 is adhered onto the base substrate 3 via the mounting adhesive 29 having thermosetting properties. The adhesion is realized in such a way that the mounting adhesive 29 is applied between the surface 3*a* of the base substrate 3 and the backside 15*b* of the support substrate 15 and is then hardened so as to mutually fix the support substrate 15 and the base substrate 3. The mounting adhesive 29 is hardened by being heated from room temperature (e.g., 25° C.) to a high temperature of 150° C., which is maintained for 60 minutes, for example. During the heating, the support substrate 15 is expanded along the surface 3*a* of the base substrate 3; hence, the support substrate 15 is fixed to the base substrate 3 in such an expanded state.

After the support substrate 15 and the base substrate 3 are mutually fixed together, the silicon microphone unit 1 and the base substrate 3 are cooled down, so that the silicon microphone unit 1 is completely mounted on the base substrate 3. During the cooling, a stress occurs between the support substrate 15 and the base substrate 3 due to differences of thermal expansion coefficients. The stress is absorbed by the mounting adhesive 29; hence, it is possible to prevent the support substrate 15 and the base substrate 3 from being unexpectedly deformed due to the stress therebetween. Thus, it is possible to easily prevent the silicon microphone chip 13 from being unexpectedly deformed.

After the silicon microphone unit 1 is completely mounted on the base substrate 3, the cover 5 for covering the silicon microphone unit 1 is fixed onto the surface 3*a* of the base substrate 3. Thus, it is possible to complete the production of the microphone package 11.

In the microphone package 11, when pressure variations such as sound pressure variations are transmitted to the diaphragm 25 of the silicon microphone chip 13 via the opening 5*c* of the cover 5, the diaphragm 25 vibrates due to pressure variations applied thereto; hence, it is possible to detect pressure variations.

According to the manufacturing method of the silicon microphone chip 1, when the support 21 of the silicon microphone chip 13 is adhered onto the surface 15*a* of the support substrate 15, it is possible to easily reduce the tensile stress of the diaphragm 25 by way of the contraction of the support substrate 15; hence, it is possible to improve the sensitivity of the silicon microphone chip 13. In particular, the thermosetting adhesive 27 has a prescribed tensile elastic modulus that allows the contraction of the support substrate 15, which occurs when the silicon microphone chip 13 and the support substrate 15 are cooled, to be transmitted to the support 21 of the silicon microphone chip 13. This makes it possible to reliably reduce the tensile stress of the diaphragm 25.

Due to a reduction of the tensile stress, the diaphragm 25 is not necessarily separated from the support 21 of the silicon microphone chip 13 in the present invention compared with the conventionally-known technology; hence, it is possible to prevent the strength of the diaphragm 25 from being unexpected degraded during the manufacturing.

According to the mounting method of the silicon microphone unit 1 mounted on the base substrate 3, the silicon microphone unit 1 is produced in advance and is then mounted on the base substrate 3. This makes it possible to prevent the silicon microphone chip 13 from being unexpectedly deformed irrespective of thermal cycles in which the silicon microphone unit 1 and the base substrate 3 are repeatedly heated and cooled. That is, it is possible to prevent a stress from occurring in the diaphragm 25 when the silicon microphone chip 13 is mounted on the base substrate 3. In short, it is possible to reliably prevent the diaphragm 25 from being unexpectedly affected by expansion and contraction of the base substrate 3 due to thermal cycles.

Next, a variation of the present embodiment will be described with reference to FIG. 3. Herein, a silicon microphone unit (or a semiconductor microphone unit) 31 has a support substrate 33, which differs from the support substrate 15 of the silicon microphone unit 1 in structure. Hence, the structural difference will be described with respect to the silicon microphone unit 31, wherein parts identical to those of the silicon microphone unit 1 and the microphone package 11 are designated by the same reference numerals; hence, the descriptions thereof are omitted as necessary.

Figure 3:
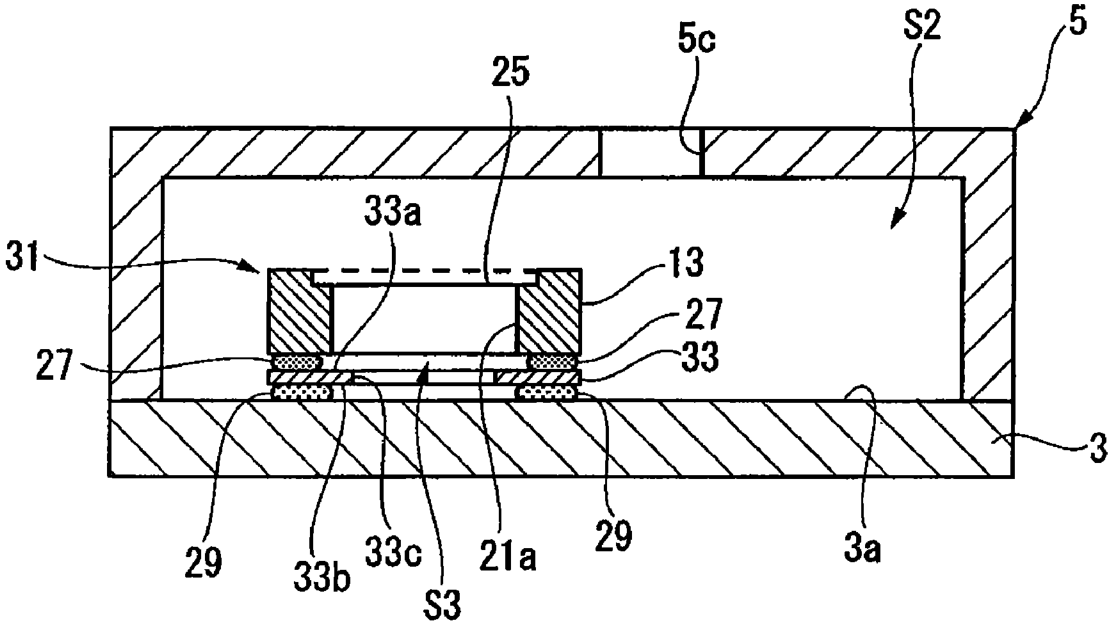
FIG. 3 is a cross-sectional view showing the constitution of the microphone package having a silicon microphone unit in accordance with a variation of the preferred embodiment of the present invention.

In the silicon microphone unit 31 shown in FIG. 3, a through-hole 33*c* runs through the support substrate 33 from a surface 33*a* to a backside 33*b*. The diaphragm 25 is exposed to the exterior of the silicon microphone unit 31 by way of the inner hole 21*a* of the silicon microphone chip 13 via the through-hole 33*c* of the support substrate 33.

Similar to the silicon microphone unit 1, the silicon microphone unit 31 is mounted on the surface 3*a* of the base substrate 3 in such a way that the backside 33*b* of the support substrate 33 is positioned opposite to the surface 3*a* of the base substrate 3, and then the support substrate 33 is adhered to the base substrate 3 by means of the mounting adhesive 29. After the silicon microphone unit 31 is completely mounted on the surface 3*a* of the base substrate 3, the diaphragm 25 directly faces the base substrate 3 via the inner hole 21*a* and the through-hole 33*c*.

The mounting adhesive 29 is applied and embedded between the surrounding area of the through-hole 33*c* of the support substrate 33 and the base substrate 3. After the mounting adhesive 29 is hardened, a cavity S3, which is defined by the inner hole 21*a*, the through-hole 33*c*, the diaphragm 25, and the base substrate 3, is sealed from the external space in an airtight manner. Due to the sealing of the cavity S3, pressure differences may occur on both ends of the diaphragm 25 in response to temperature variations and atmospheric pressure variations. For this reason, it is possible to form thin holes allowing the cavity S3 to communicate with the external space by use of prescribed areas between the base substrate 3 and the support substrate 33, which the mounting adhesive 29 is not applied to.

Due to the formation of the through-hole 33*c* of the support substrate 33, the silicon microphone unit 31 has a relatively large cavity S3, which is larger than the cavity S1 of the silicon microphone unit 1. That is, the silicon microphone unit 31 can increase the volume of the cavity S3 in comparison with the cavity S1 of the silicon microphone unit 1.

When the silicon microphone unit has a relatively small cavity, the internal pressure of the cavity may easily increase due to vibration of the diaphragm 25; hence, the diaphragm 25 may be difficult to be deflected. The silicon microphone unit 31 is designed to increase the volume of the cavity S3, by which it is possible to suppress the pressure increase inside of the cavity S3; hence, it is possible for the diaphragm 25 to be easily deflected. This prevents the sensitivity of the silicon microphone chip 13 from being reduced.

The thermosetting adhesive 27 is not necessarily limited to the aforementioned one. It is simply required that the hardened thermosetting adhesive 27 have a tensile elastic modulus allowing the contractions of the support substrates 15 and 33 to be transmitted to the silicon microphone chip 13 when the silicon microphone chip 13 is cooled together with the support substrates 15 and 33. Specifically, it is preferable that the tensile elastic modulus of the thermosetting adhesive 27 be equal to 3600 MPa or more.

The mounting adhesive 29 is not necessarily limited to the aforementioned one. It is simply required that the hardened mounting adhesive 29 have a tensile elastic modulus allowing the stress, which occurs between the base substrate 3 and the support substrates 15 and 33 due to differences of thermal expansion coefficients, to be absorbed. Specifically, it is preferable that the tensile elastic modulus of the mounting adhesive 29 be in the range of 300 MPa to 500 MPa.

When both of the base substrate 3 and the support substrates 15 and 33 have the same thermal expansion coefficient, no stress occurs during cooling. In this case, it is not necessary that the mounting adhesive 29 have a tensile elastic modulus allowing the stress to be absorbed.

The mounting adhesive 29 does not necessarily have the thermosetting property. It is simply required that the mounting adhesive 29 allow the base substrate 3 and the support substrate 15 to be mutually fixed together.

Each of the inner hole 21*a*, the back plate 23, and the diaphragm 25 included in the silicon microphone chip 13 is formed in a circular shape in plan view; but this is not a restriction. For example, each of them can be formed in a polygonal shape in plan view. In addition, the support 21 is not necessarily formed in a ring shape in plan view; hence, it can be formed in a polygonal ring shape in plan view.

The silicon microphone unit 1 is mounted on the surface 3*a* of the base substrate 3 in the microphone package 11; but this is not a restriction. For example, the silicon microphone unit 1 can be directly mounted on a circuit board (or a substrate, not shown). In this case, the support substrate 15 is adhered onto the surface of the circuit board via the mounting adhesive 29.

Lastly, the present invention is not necessarily limited to the aforementioned embodiment and variation; hence, it can be further modified in a variety of ways within the scope of the invention defined by the appended claims.

What is claimed is:

1. A semiconductor microphone unit comprising:

a semiconductor microphone chip that has a diaphragm covering an inner hole of a support; and a support substrate whose thermal expansion coefficient is higher than the thermal expansion coefficient of the support, wherein the support is adhered onto a surface of the support substrate via a thermosetting adhesive in such a way that the diaphragm is positioned opposite to the surface of the support substrate.

2. The semiconductor microphone unit according to claim 1, wherein the thermosetting adhesive has a tensile elastic modulus that allows a contraction, which occurs in the support substrate when the semiconductor microphone chip and the support substrate are cooled, to be transmitted to the support in a hardened state of the thermosetting adhesive.

3. The semiconductor microphone unit according to claim 1, wherein a through-hole is formed in the support substrate so as to expose the diaphragm to an exterior via the inner hole.

4. The semiconductor microphone unit according to claim 2, wherein a through-hole is formed in the support substrate so as to expose the diaphragm to an exterior via the inner hole.

* * * * *